US006433609B1

(12) United States Patent
Voldman

(10) Patent No.: US 6,433,609 B1
(45) Date of Patent: Aug. 13, 2002

(54) DOUBLE-GATE LOW POWER SOI ACTIVE CLAMP NETWORK FOR SINGLE POWER SUPPLY AND MULTIPLE POWER SUPPLY APPLICATIONS

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,105

(22) Filed: Nov. 19, 2001

(51) Int. Cl.[7] .............................. H03K 5/08; H03L 5/00
(52) U.S. Cl. ....................................... 327/313; 327/328
(58) Field of Search .............................. 327/309, 310, 327/313, 318, 321, 325, 314, 327, 328

(56) References Cited

U.S. PATENT DOCUMENTS

| | | |
|---|---|---|
| 4,989,057 A | 1/1991 | Lu |
| 5,610,790 A | 3/1997 | Staab et al. |
| 6,075,399 A * | 6/2000 | Voldman et al. ............ 327/309 |
| 6,097,065 A * | 8/2000 | Forbes et al. .............. 257/350 |
| 6,104,068 A * | 8/2000 | Forbes ...................... 257/365 |
| 6,229,372 B1 * | 5/2001 | Mashak et al. ............. 327/309 |

* cited by examiner

Primary Examiner—Terry D. Cunningham
Assistant Examiner—Quan Tra
(74) Attorney, Agent, or Firm—DeLio & Peterson, LLC; Kelly M. Reynolds; Mark F. Chadurjian

(57) ABSTRACT

A double-gated low power active clamp circuit for digital circuits includes a first double-gated MOSFET serially connected between an upper power supply voltage and an input terminal to be clamped, and a second double-gated MOSFET serially connected between a lower voltage power supply and the input terminal. The voltages at the gates of the first and second double-gated MOSFETs are held at constant reference voltages by a single or double reference circuits. The clamping action can be switched on or off. The double-gated active clamping network can be implemented with a single power supply voltage, or with multiple power supply voltages. The use of the back gates of the double-gated active clamping network enables additional clamping and ESD protection for smaller generations of transistors, such as, those having dimensions below 0.1 micron. The device is particularly suited for use with dynamic threshold double-gated silicon-on-insulator, FINFET, and bulk triple well technologies.

19 Claims, 8 Drawing Sheets

DOUBLE-GATE LOW POWER SOI ACTIVE CLAMP NETWORK FOR SINGLE POWER SUPPLY AND MULTIPLE POWER SUPPLY APPLICATIONS

BACKGROUND OF THE INVENTION

This invention relates to active clamp circuits for providing electrical overshoot and undershoot protection, particularly in double gate silicon on insulator (SOI) integrated circuit applications.

DESCRIPTION OF RELATED ART

Over the years, digital circuits, and the voltage levels associated therewith, have decreased in size in order to keep up with modern technology. In so doing, modern digital circuits which operate at one voltage level may need to transfer signals to and/or receive signals from circuits operating at other voltage levels. Clamping circuits have been introduced in the art to allow circuits to transfer signals to and/or receive signals from circuits operating at differing voltages by partially terminating and protecting each circuit from voltages that are outside its operating range.

Clamping circuits maintain voltages within an acceptable range by controlling electrical overshoot (positive) and undershoot (negative) at the signal input of a digital circuit to provide a reliable logic signal under adverse and noisy conditions. In an ideal system, the input voltage to each element in a digital circuit will be in only one of two distinct logic states, either an upper digital voltage or a lower digital voltage. The upper digital voltage (or positive terminal) of the power supply (referred to herein as Vdd) corresponds to the digital ones of the circuit and is typically +5 volts and may be 3.3, 2.5, 1.8, 1.2 volts or even lower in newer designs. The lower digital voltage of the power supply (referred to herein as Vss) corresponds to the digital zeros of the circuit and is typically at ground potential which may be zero volts.

Ideally, the input voltage switches instantly between the up state and the down state, never going above the upper voltage nor below the lower voltage, and spending substantially no time at any intervening voltage between the two states. However, in real circuits the input voltage generally takes a finite amount of time to switch between the two logic states wherein the input voltage often exceeds the upper limit, i.e., overshoots the voltage, and oscillates (or rings) around this new voltage before settling down. Clamping circuits have been designed to minimize such ringing as it can seriously degrade the circuit's performance. Typically, a good clamping circuit dampens ringing and reduces noise so that the signal at the input remains at or near one of the two desired voltage states (Vdd or Vss) and switches between these two states quickly and cleanly.

Improved clamping performance comes about by supplying or draining current as quickly as possible to/from the network at the input to the circuit being clamped whenever the voltage at the input exceeds or falls below the two desired voltage states. In order to supply sufficient current, the clamping circuit should have low impedance and a low reflection coefficient in the vicinity of the upper and lower voltages corresponding to the two digital logic states. However, in order to maximize switching speed between the two logic states, the impedance of the clamping circuit and the reflection coefficient should be very high during switching for the brief time when the input voltage is between the upper and lower digital voltages. Currently used passive clamping circuits are unable to effectively meet these opposing requirements for the highest performance applications.

Typically, in a passive clamping circuit, any excess signal voltage on the input is pulled towards or clamped to the positive Vdd supply voltage while any lower signal voltage state is pulled towards or clamped to the lower voltage supply Vss or ground. As transistors continually decrease in size and the upper digital voltage of the power supply (Vdd) associated therewith decreases, i.e., 1.2 volts or even lower in newer designs, passive clamping circuits are unable to effectively supply or drain current whenever the voltage at the input exceeds or falls below the two desired voltage states.

For example, a typical prior art 5.0 volt system has used a passive clamping circuit in which one diode, having a 0.7 turnout voltage, is placed between the input terminal and Vss (zero volts) and another is placed between the input and Vdd (5.0 volts). The diode between the input terminal and Vdd will conduct when the voltage at the input terminal rises sufficiently above the upper digital voltage to turn on the diode. Thus, this diode limits the input voltage to about 0.7 volts above the desired maximum input voltage, or to about 5.7 volts, but permits 0.7 volt ringing around the upper digital voltage. The second diode is positioned between the input terminal and Vss and conducts when the voltage at the input terminal falls one diode drop below the lower digital voltage (usually zero volts). This prevents ringing in excess of about 0.7 volts, but still permits ringing having a magnitude less than the value needed to turn on the passive diode clamp.

Passive clamp circuits of this type work in 5.0 volt systems because the amplitude of the ringing is relatively small compared to the difference between the upper and lower digital voltages. However, in modern systems having lower maximum input voltages and thus smaller differences between the upper and lower digital voltages, passive clamp circuits of this type are not effective. The 0.7 volt degrades into the noise tolerance of the lower voltage system, such as a 3.3 volt system. Moreover, in 2.5, 1.8, 1.2 and even lower volt systems, such ringing is unacceptable as it produces erratic operation in noisy environments. For example in a 1.0 maximum input volt system, the amplitude of the ringing is large compared to the difference between the upper and lower digital voltages as the diode providing 0.7 volts above the maximum input voltage of 1.0 volt would almost double such voltage, i.e., to about 1.7 volts, causing erratic operation. Accordingly, lower voltage designs need even more careful control over the input signal to prevent erratic operation due to ringing or other noise at the input.

Performance is also improved by driving the input terminal voltage to the upper digital voltage via a connection to Vss when the input voltage is too high (above the upper voltage which is usually Vdd) and by driving the input terminal voltage to the lower digital voltage via a connection to Vdd when the input terminal voltage is too low (below the lower digital voltage which is usually Vss). This increases the speed at which the clamping circuit operates as compared to prior art designs which drive excessively low voltages through a connection to the low voltage supply (Vss) and excessively high voltages through a connection to the high voltage supply (Vdd).

Another requirement for digital circuits is some form of electrostatic discharge (ESD) protection. Generally, separate ESD protection circuits are provided at the input of the circuit to limit the voltage that can be imposed on the circuit at the input terminal even when the circuit is unpowered. It would be desirable if the ESD protection could be incorporated into the clamping circuit. The ability to rapidly supply or drain current is important for both clamping and ESD protection. Older designs for clamping circuits that use current limiting resistors do not provide good ESD protection.

As metal oxide semiconductor technology has improved, MOS devices have been constructed with shorter gate lengths, thinner gate oxides and faster response times. As the gate oxide becomes thinner, the device must be powered with a lower voltage power supply to avoid breakdowns and leakage. Lower power supply voltages are also advantageous in reducing power consumption, decreasing heating, and increasing speed through smaller voltage swings. Good ESD protection for lower voltage designs is critical.

To avoid some of the problems with older MOS devices, source terminated drivers have been used in MOS circuits to lower the drive current of the driver into the net. Unfortunately, this increases delay and slows circuit response. Another problem with this solution is due to complex process tolerance requirements during construction of MOS devices. This results in poor control of the driver output impedance which also causes ringing.

Silicon-on-insulator (SOI) technology further improves the speed at which transistors perform and reduces the voltages required. The SOI layer not only reduces the capacitance of the semiconductor switch so it operates faster, but also eliminates the "body effect" which causes lower current and lower performance in bulk CMOS technology. Due to the SOI characteristics, it can operate at lower power than MOS technology.

For SOI designs and low voltage MOS designs, an active clamping circuit is needed, particularly in high performance low voltage designs where the clamp must hold the ringing to much less than the 0.7 volt limit of a passive diode clamp. Active clamp circuits employing transistors instead of diodes are known, but heretofore they have been bipolar in design, and thus are not suited for construction with the remainder of the MOS circuitry.

Another difficulty with prior art designs is that they have been similar to the passive diode clamp circuit described above. They have clamped the high logic signal to the higher Vdd power supply and the lower voltage logic signal to the lower voltage supply Vss. While this is functional, it cannot supply current as quickly to damp out ringing and noise as can a circuit designed according to the present invention. A further problem with prior art clamping circuit designs is the use of current limiting resistors which slow the clamping circuit response time and make them unsuitable for modern high speed MOS field effect transistor (MOSFET) circuits and SOI circuits.

As transistors continue to decrease in size, both power supply voltages and signal voltages associated therewith also continue to decrease. However, as such signal voltages decrease the detectable range of signals also decrease therewith, making it more and more difficult to maintain voltages within an acceptable range by controlling electrical overshoot and undershoot.

Accordingly, as devices become smaller and more sensitive, there continues to be a need for providing reliable logic signals of digital circuits under adverse and noisy conditions. There also continues to be a need for low power consumption designs for active clamping circuits and for circuits that may be turned off remotely, particularly during testing operations.

Bearing in mind the problems and deficiencies of the prior art, it is therefore an object of the present invention to provide a clamping circuit specifically adapted for MOS, SOI circuits and triple well technologies that turns on immediately at the desired clamping voltage, instead of at a diode voltage drop away from the desired voltage.

It is another object of the present invention to provide a clamping circuit that has high impedance during switching, for high switching speed, but low impedance when clamping (for rapid reduction of any ringing).

A further object of the invention is to provide a clamping circuit that may be switched on and off.

Still another object of the present invention is to provide a clamping circuit which has low power consumption.

It is yet another object of the present invention to provide a clamping circuit that provides ESD protection at the input of an attached circuit.

Another object of the present invention is to provide an active clamping circuit which also operates when unpowered to provide ESD protection.

Still another object of the present invention is to provide a clamping circuit suitable for use with low voltage power supply systems, including 2.5 volt, 1.8 volt and lower voltage power supply systems.

Another object of the invention is to provide a clamping circuit which provides compatibility between two systems of different voltage levels.

Still another object of the invention is to provide a clamping system which has the capability of selecting more than one voltage level to clamp.

Yet another object of the invention is to synthesize the ESD function and active clamping function into a common circuit to provide area reduction.

Another object of the present invention is to provide lower capacitance.

Still other objects and advantages of the invention will in part be obvious and will in part be apparent from the specification.

BRIEF SUMMARY OF THE INVENTION

The above and other objects and advantages, which will be apparent to one of skill in the art, are achieved in the present invention which is directed to, in a first aspect, a double-gated clamping circuit having an input terminal for receiving an input voltage, a first power supply terminal for connection to a first supply voltage, and a second power supply terminal for connection to a second supply voltage, the second supply voltage being less than the first supply voltage.

A first transistor having a first and a second control lead is serially connected between the first power supply terminal and the input terminal and a second transistor also having a first and a second control lead is serially connected between the second power supply terminal and the input terminal. A reference circuit is coupled to the first and second control leads of the first and second transistors for maintaining at least first and second preselected reference voltages at the first and second control leads of the first and second transistors, respectively. The first reference voltage from the reference circuit is less than the second reference voltage. Preferably, at least one of the first and second transistors is a dynamic threshold voltage MOS field effect transistor.

Additionally, at least one staging circuit may be coupled to the first and second control leads of at least one of the first and second transistors to determine a selected reference voltage at the control lead to which the at least one staging circuit is coupled.

The first control leads of both the first and second transistors are coupled to a first reference circuit while the second control leads of both the first and second transistors are coupled to a second reference circuit. In so doing, the first and second reference circuits maintain the preselected reference voltages at the first and second control leads.

In an embodiment of the invention, the first and second reference circuits maintain first, second, third, and fourth preselected reference voltages at the first and second control leads of each the first and second transistors. In such embodiment, the first and third preselected reference voltages are at the first and second control leads of the first transistors, respectively, and the second and fourth preselected reference voltages are at the first and second control leads of the second transistors, respectively. The first reference voltage being less than the second reference voltage and the third reference voltage being less than the fourth reference voltage.

Preferably, the first and second transistors each having the first and second control leads are a first double-gated transistor having a front gate and a back gate and a second double-gated transistor having a front gate and a back gate.

In accordance with an embodiment of the invention, the first and second control leads of the first transistor may be electrically coupled to each other while the first and second control leads of the second transistor are also electrically coupled to each other. Still further, the first and second control leads of the first and second transistors may be symmetrical, or alternatively, asymmetrical.

The first reference voltage is adjusted to switch on the first transistor and connect the input terminal to the first power supply terminal when the input voltage passes a first limit voltage. The second reference voltage is adjusted to switch on the second MOS field effect transistor and connect the input terminal to the second power supply terminal when the input voltage passes a second limit voltage.

The first reference voltage is preferably adjusted to the second supply voltage plus the threshold voltage of the first MOSFET and the second reference voltage is preferably adjusted to the first supply voltage minus the threshold voltage of the second MOSFET.

In the preferred embodiment of the invention, the first and second transistors are constructed as dynamic threshold voltage MOS field effect transistors (DTMOS). The use of DTMOS devices, with appropriate connection of the body of the DTMOS provides a circuit with significantly improved performance.

In the DTMOS design the DTMOS field effect transistors have bodies constructed on the substrate which can be electrically isolated from other devices on the substrate. This may be accomplished through the use of silicon-on-insulator (SOI) substrates, FINFET designs or through triple well implementations in which the transistor is electrically isolated via the diode junctions formed by the multiple wells.

The instant double-gated clamping circuit may be in combination with a circuit having a circuit input whereby the input terminal of the double-gated clamping circuit is directly connected to the circuit input. In so doing, the double-gated clamping circuit prevents overshoot and undershoot of the input voltage relative to desired input voltages at the circuit input. Alternatively, the double-gated clamping circuit is directly connected to the circuit input whereby the double-gated clamping circuit provides electrostatic discharge protection to the input terminal of the circuit.

In accordance with the invention, the reference circuit comprises at least one reference circuit having a third transistor coupled to the second power supply terminal and a fourth transistor coupled to the first power supply terminal. The third and fourth transistors are serially connected between the first and second power supply terminals.

In another aspect, the instant invention provides a double-gated clamping circuit having an input for receiving an input voltage and a double-gated transistor circuit for clamping the input at both a first voltage and at a second voltage.

The double-gated transistor circuit includes a first double-gated transistor coupled to a first power supply terminal at the first voltage and to the input. The first double-gated transistor has a first and a second gate directly coupled to each other to connect the input to the first power supply terminal through the first transistor when the first transistor is turned on.

The double-gated transistor circuit also includes a second double-gated transistor coupled to a second power supply terminal at the second voltage and to the input. The second double-gated transistor has a first and a second gate directly coupled to each other to connect the input to the second power supply terminal through the second transistor when the second double-gated transistor is turned on.

A reference circuit is coupled to the first and second coupled gates of the first double-gated transistor and to the first and second coupled gates of the second double-gated transistor for maintaining preselected constant gate voltages at the first and second gates of each of the first and second double-gated transistors. The gate voltages are independent of the input voltage.

Alternatively, the first and second gates of each of the first double-gated transistors may not be coupled to each other whereby a first reference circuit is coupled to the first gates of each of the first and second double-gated transistors for maintaining preselected constant gate voltages at the first and second gates of each of the first and second double-gated transistors. A second reference circuit is coupled to the second gates of each of the first and second double-gated transistors for further maintaining the preselected constant gate voltages at the first and second gates of each of the first and second double-gated transistors.

BRIEF DESCRIPTION OF THE SEVERAL VIEWS OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Description of the Preferred Embodiment(s)

Figure 1A:
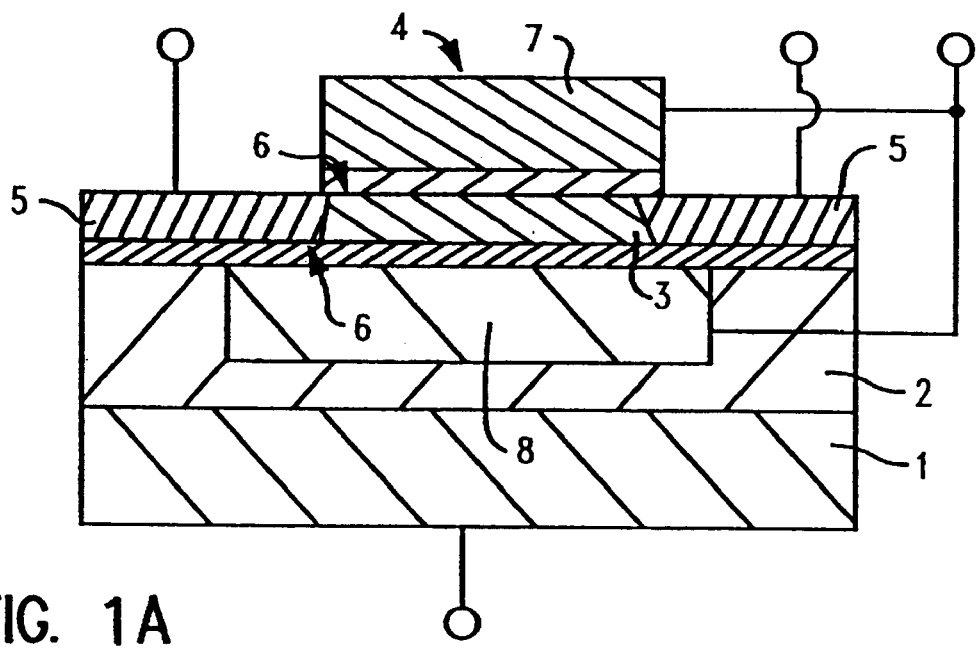
FIGS. 1A–1B illustrate that the instant double-gated active clamping network may be built on silicon-on-insulator substrates to provide a first and a second double-gated MOSFET.

In describing the preferred embodiment of the present invention, reference will be made herein to FIGS. 1–8 of the drawings in which like numerals refer to like features of the invention.

As transistors are decreasing in size, the dielectrics thereof are becoming thinner and the breakdown voltages are decreasing, thereby causing an increase in reflection. As will be recognized, an increase in reflection may lead to approximately a doubling of the voltage which confuses the transistor as to the actual voltage. Accordingly, as transistors are continually being scaled down in size, the reflection thereof needs to be eliminated as well as preventing the voltages from going over the native power supply voltage of the transistor.

The present invention solves the above problem by providing a dual gate silicon on insulator (SOI) active clamp network for providing electrical overshoot and undershoot protection for double-gated SOI technology. In so doing the second or back gate of the circuit is connected to the gate reference electrodes to provide electrical overshoot and undershoot protection. In accordance with the invention, the second or back gate may be used simultaneously with the from gate, or alternatively, the second gate may be used as a back-up gate to provide electrical overshoot and undershoot protection. Furthermore, the use of the back gate in parallel with the front gate provides a second switching phase that has a second multiple turn on.

Accordingly, the instant double-gated clamping network provides use of a bottom gate, in addition to a top gate, for electrical overshoot and undershoot protection, utilization of dynamic threshold conditions for the bottom gate and/or top gate, use of the bottom gate for ESD protection, provides for multiple switching states as a result of use of the two-state switching conduction, as well as use of a single state current switching with improved lower resistance. In accordance with the invention, the second gate electrode of the double-gated SOI active clamping circuit may comprise the same doping concentration as the first gate electrode for more current drive, or may comprise a second doping concentration for lower power. The instant active double-gated clamping circuit improves performance by activating the clamp as soon as or slightly before the input terminal voltage swings above or below the bounds set by the upper and lower digital voltages.

In accordance with the invention, the double-gated active clamping circuit advantageously provides a higher current drive, lower series resistance, a higher density clamping network, faster switching transitions, faster switching transitions in multiple impedance states, improved ESD robustness, and high breakdown voltage bottom gate structure to avoid gate rupture in comparison to a single gated active clamping circuit.

In more detail, the double-gated clamping circuit achieves a higher current drive as a result of the current conduction being achieved on both surfaces of the clamping FET, i.e., conduction may be established on the top and bottom gate. The higher current drive achieved by using the back gate of a double-gated clamping circuit provides additional current drive allowing for a circuit with an overall higher performance. The instant double-gated clamping circuit also provides a lower series impedance as a result of the lower resistance in the FET channel region. With the higher current conduction, the series resistance is lower allowing for a faster transition when the transistors are in the on-state, which allows for discharge of larger overshoot and undershoot conditions. A higher density clamping network is also achieved by the invention as the instant transistor utilizes both the top and bottom surfaces thereby providing more current drive per unit area, while also allowing for a smaller circuit.

Moreover, the instant double-gated clamping network also advantageously allows for a faster switching transition between the positive and negative transitions as a result of the lower impedance, thereby providing for fast switching of overshoot and undershoot conditions. The invention also enables faster multiple switching transitions due to the lower impedance. In so doing, the invention provides clamping for large current transitions, as well as multiple clamping states depending on the threshold voltages to further provide faster switching of overshoot and undershoot conditions. The instant double-gated clamping circuit also provides improved ESD robustness as a result of the circuit providing higher current discharge from the input pad to the power rails. Additionally, the invention provides a high breakdown voltage bottom gate structure to avoid gate rupture. In such an implementation, the breakdown voltage of the bottom gate of the double-gated clamping circuit can be significantly higher than the front gate. Accordingly, as a dielectric layer of the instant double-gated clamping circuit is scaled down, the first gate, i.e., top gate, can be utilized for normal operation while the second gate, i.e., the bottom gate, can be utilized for ESD protection.

The present invention provides additional layers of functionality upon both active clamp circuits for a single voltage level as disclosed in U.S. Pat. No. 6,075,399 entitled "Switchable Active Clamp Network" (herein incorporated by reference), and active clamp circuits for clamping more than one voltage level as disclosed in U.S. Pat. No. 6,229,372 B1 entitled "Active Clamp Network For Multiple Voltages" (herein incorporated by reference). The instant invention advantageously extends the use of such active clamping networks into future generations of transistors by introducing the use of a second or back gate of a double-gated active clamping network for ESD protection.

Figure 3:
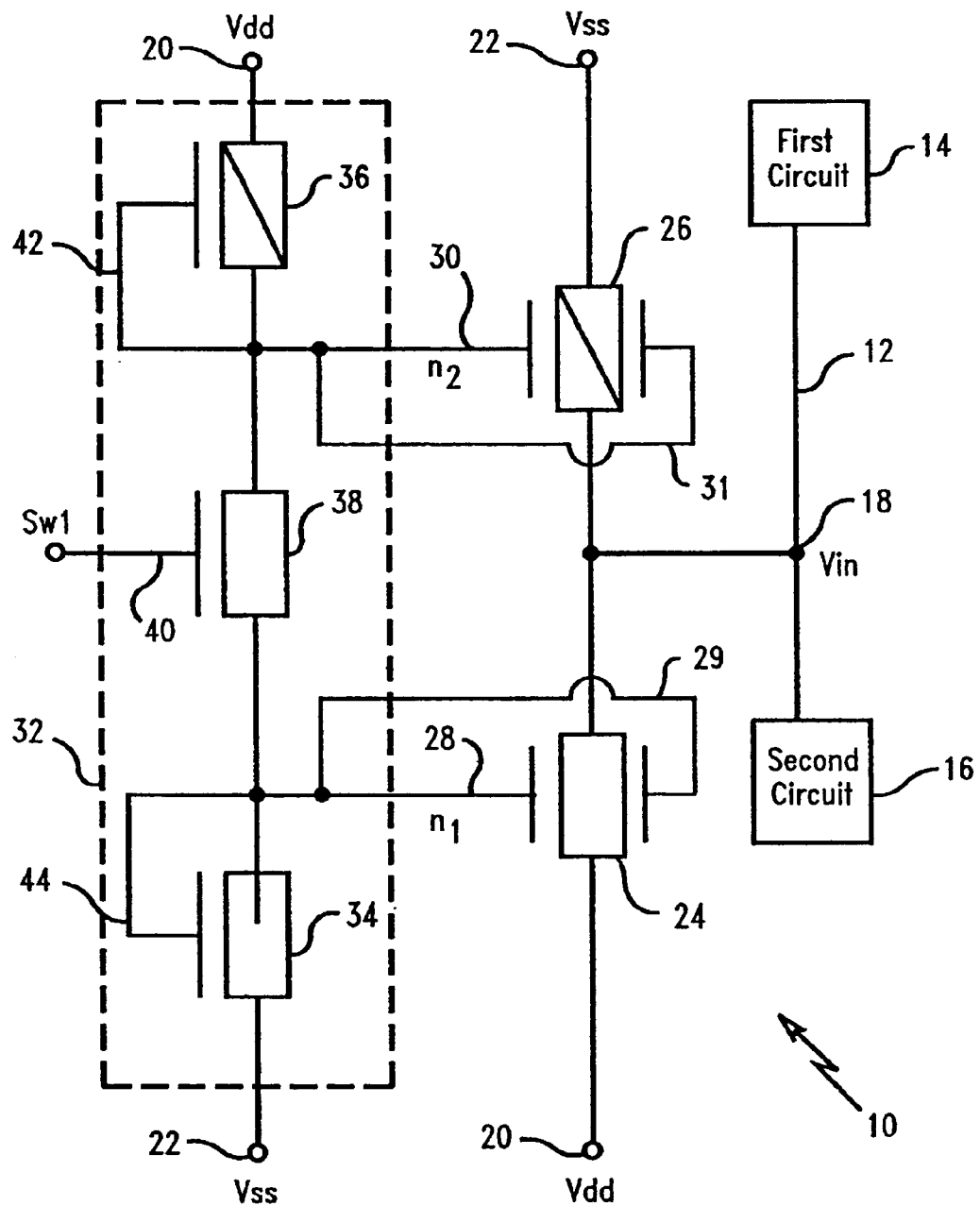
FIG. 3 is a circuit diagram showing a first embodiment of the present invention in which the instant double-gated active clamping network is connected to a single reference control circuit and a single power supply voltage.

In accordance with the invention, as illustrated in FIG. 3, the instant double-gated active clamping circuit 10 reduces ringing on a network 12 carrying signals from a first circuit 14 to a second circuit 16. An input terminal 18 connects the clamping circuit 10 to the input of circuit 16. Generally, circuit 10 and circuit 16 will be constructed simultaneously and the input 18 will be very close to both circuits whereas circuit 14 and/or additional circuits communicating over network 12 will be located at a more distant location. It is preferred that the electronic systems in which the circuits 10, 14, and 16 are located are computer systems and the network 12 may be connecting different components such as different memory or processor buses or a memory controller within a single computer system or may be connecting different electronic components between two computers or other electronic systems which need to communicate data.

The upper digital voltage corresponding to a binary one is equal to the upper power supply voltage Vdd. Although clamping circuit 10 of the invention may be used with standard five volt digital logic designs, it is most valuable when used with circuits in which Vdd is less than 5 volts, such as 3.3 volt, 2.5 volt, 1.8 volt, 1.5 volts, 1.2 volt and even lower voltage systems as future technology continues to scale down in size, preferably, such as voltage systems below sub-0.X where "X" is an integer below 9, more preferably, below sub-0.7 volt power supplies. The lower digital voltage corresponding to a binary zero is equal to the lower power supply voltage Vss, which is at ground potential, or zero volts. Although the upper and lower digital voltages are often the same as the upper and lower power supply voltages, this is not necessary, nor is it necessary for the lower power supply voltage to be set to the ground potential.

As further shown in FIG. 3, circuit 10 is connected to the first power supply Vdd through a first power supply terminal 20 and to the second power supply Vss through a second power supply terminal 22. The second power supply voltage Vss is lower than Vdd. The right half of FIG. 3 is drawn inverted with the upper voltage Vdd at the bottom and the lower voltage Vss at the top of the circuit. In accordance with the invention, active clamping of circuit 10 is accomplished with first and second double-gated clamping transistors, e.g., such as double-gated clamping MOSFET 24 and 26 shown in FIG. 3 and further described below, which are serially connected between an upper voltage power supply terminal 20 and input terminal 18.

In FIG. 3, the double-gated clamping transistor 24 is turned on, as described below, to briefly connect input terminal 18 to the upper power supply voltage Vdd via terminal 20 whenever the input terminal voltage at 18 is below the clamping lower voltage Vss. The double-gated clamping MOSFET 26 works in a complementary manner to the operation of double-gated clamping MOSFET 24. In the invention, the double-gated clamping MOSFET 26 is serially connected between the input terminal 18 and the second power supply terminal 22 and it turns on, as described below, to connect input terminal 18 to the lower power supply voltage Vss whenever the input terminal voltage at 18 is above the upper digital voltage Vdd. Even though the lower power supply voltage Vss has been drawn at the top of the circuit on the right half of FIG. 3, and even though the upper transistor (double-gated clamping MOSFET 26) is connected to the lower power supply voltage Vss, it will be understood from the description above that the upper transistor (double-gated clamping MOSFET 26) does control clamping about the upper digital voltage (equal to Vdd in this example) whereas the lower transistor (Clamping MOSFET 26) controls clamping about the lower digital voltage (equal to Vss in this example).

In accordance with the instant active clamping circuit 10, the preferred double-gated clamping transistors 24 and 26 may be created using double-gated SOI technology, FINFET technology, triple well technology having an N-well and P-well isolated from the substrate, or any other comparable double-gated technology known and used in the art. It will be appreciated by others in the art that boolean equivalents and/or other transistors of other double-gated semiconductor technology can also be used in the instant invention. The SOI technique is one that forms a specified semiconductor integrated circuit device on a semiconductor thin film layer, such as a thin surface silicon film, formed on a buried insulating layer, such as a buried oxide layer. The SOI substrate may be made by any of the well known SOI substrate construction techniques. In the FINFET embodiment of the instant double-gated clamping devices 24 and 26, the FINFET is a non-planar structure having at least one gate wrapped around a thin silicon island which is above an insulator layer, as opposed to the planar surfaces of the SOI embodiment.

Figure 1B:
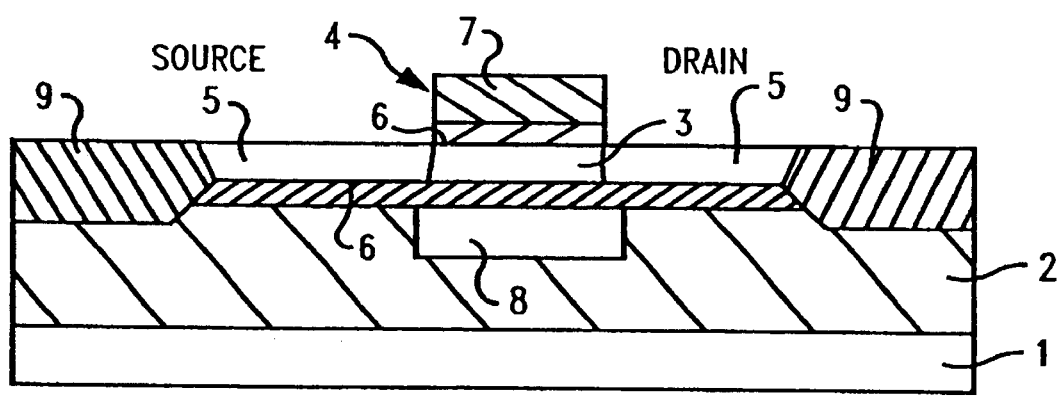

As shown in FIGS. 1A–1B, the instant active clamping circuit 10 may be built on silicon-on-insulator substrates (SOI) to provide first and second double-gated metal oxide semiconductor field effect transistors (MOSFETs) 24 and 26, each built on SOI. More preferably, double-gated MOSFET 24 is an N-type MOSFET 24, and double-gated MOSFET 26 is a P-type MOSFET 26. As described in more detail, each MOSFET of the double-gated SOI active clamping circuit may be formed, for example, by depositing an insulation layer 2 on a semiconductor substrate 1 followed by depositing a semiconductor layer 3 over the insulation layer 2. On the semiconductor layer 3 is formed an n-type MOSFET 4, which consists of a pair of semiconductor regions 5, 5 being source/drain regions formed in the semiconductor layer 3, a gate insulation film 6 overlying the semiconductor layer 3, and a first gate electrode 7 of p-type polysilicon formed over the gate insulation film 6. A second, buried gate electrode 8 is also formed in the insulation layer 7 separated from the semiconductor layer 3 by gate insulation film 6. The second gate electrode 8 has a size sufficient to substantially overlap the pair of semiconductor regions 5, 5 source/drain regions to permit the threshold voltage of the MOSFET 4 to be set at a desired value with the impurity concentration lowered in the channel region of the MOSFET 4. The second gate electrode 8 (or the back gate) is electrically connected to the first gate electrode 7 of the MOSFET 4 and is formed directly under the back-gate insulation film 6, such as a $SiO_2$ layer, and between thick field oxide regions 9, 9.

Figure 2A:
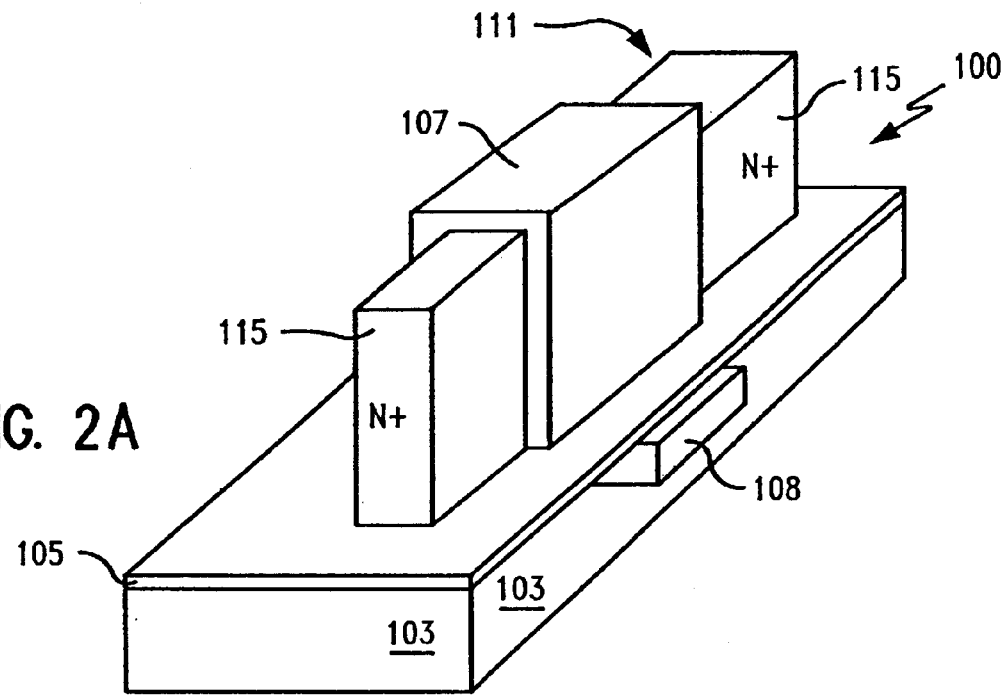
FIGS. 2A–2B illustrate that the instant double-gated active clamping network may be built on silicon-on-insulator substrates to provide a first and a second double-gated FINFET.
Figure 2B:
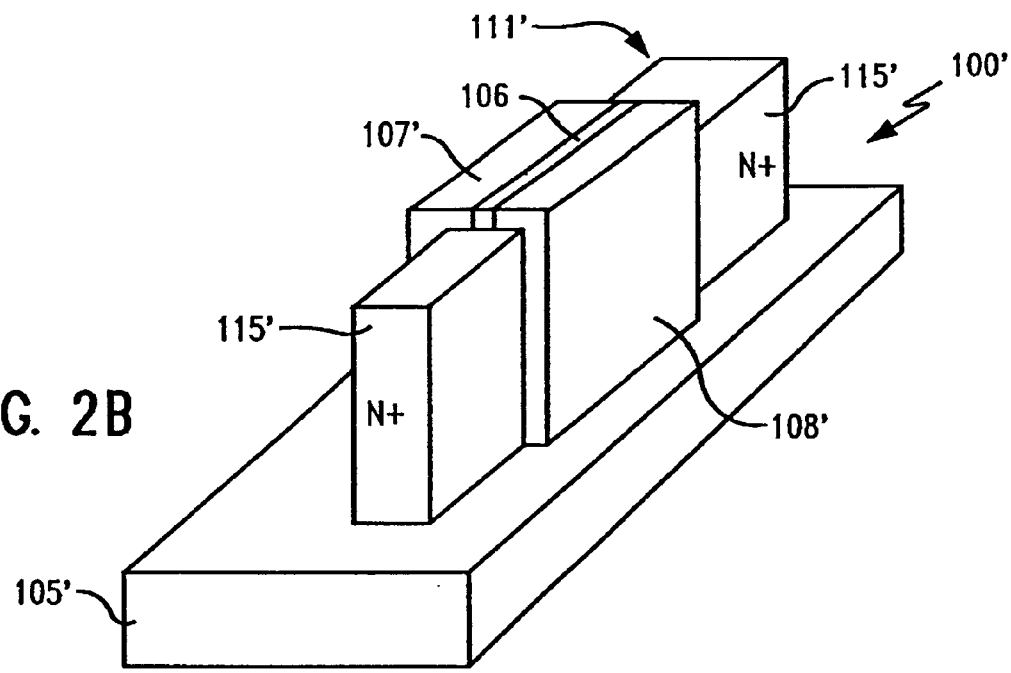

Alternatively, the instant active clamping circuit 10 may be built using FINFET technology to provide first and second double-gated FINFET transistors. As illustrated in FIGS. 2A and 2B, each double-gated FINFET transistor may be provided using an SOI wafer, such as a Silicon on Sapphire (SOS) wafer, formed by known techniques including, for example, epitaxial lateral overgrowth, Silicon-Bonding-and-Etch-Back (SIBOND), silicon implantation (SIMOX), cleaving processes ("smart cut" techniques), and the like.

In a first embodiment of the double-gated FINFET transistors, as shown in FIG. 2A, the double-gated FINFET 100 may be provided by first forming a bottom gate 108 in a buried oxide (BOX) region 103 by known techniques for formation of a bottom gate SOI device. For example, the bottom gate 108 of the present double-gated FINFET 100 clamping network may be formed by providing an insulator layer on a silicon wafer, etching a region in the insulator layer, deposition of a gate material thereover the wafer followed by providing a second insulator film thereover the film, and subsequently bonding with a second wafer of silicon. The bottom gate 108 may comprise a conductive material including metal, polysilicon or any other conductive material known and used in the art. The top gate 107 of the instant FINFET transistors may then be formed by standard FINFET development procedures. In so doing, a thin rectangular region 111 of silicon, or silicon island, is formed on the insulator layer 105 after an etch step. A gate dielectric material is then formed around a middle portion of the silicon island 111 to form the top gate 107 of the double-gated FINFET clamping circuit over the insulator layer 105. As shown, the top gate wraps around portions of the edges and a portion of the top surface of the silicon island. Alternatively, spacers may be formed at the gate edges as part of the gate structure. Subsequently, source and drain regions 115 may be implanted using known source/drain implant techniques, e.g., low doped drain, abrupt junction, extension implants, halo implants, and the like.

In a second embodiment of the double-gated FINFET transistors, as shown in FIG. 2B, a double-gated FINFET 100' may be provided by splitting the FINFET formed by standard FINFET development procedures as described above in relation to the formation of the top gate 107 of FINFET 100. In so doing, FINFET 100' may be formed using SOI technology. A thin rectangular region 111' of silicon, or silicon island, is formed on the insulator layer 105', after an etch step, followed by formation of a gate dielectric material around a middle portion of the silicon island 111' to form a gate structure over the gate insulator. Source and drain regions 115' are implanted. A portion of the gate dielectric material at the middle of the gate structure is removed by etching and then an insulator layer 106, such as an oxide, is provided in such removed portion of the gate structure, thereby splitting the gate structure into a first, front gate 107' and a second, back gate 108'.

In accordance with the invention, the first gate (or front gate) and the second (or back gate) of each of the double-gated active clamp circuits may be formed using conventional materials as known and used in the art. In so doing, the front and back gates may be symmetrical or asymmetrical. In particular, the front and back gates may be formed symmetrical being of the same doping concentration to provide the circuit with increased current drive. Alternatively, the front and back gates may be formed asymmetrical being of differing doping concentrations for lower power. For example, each of the double-gated clamping circuits of the invention may be formed with P-type front and back gates, P-type front gate with N-type back gate, or an N-type front gate with a P-type back gate.

For ease of understanding the invention, the instant active clamping circuit 10 will be describe in more detail below in conjunction with the double-gated SOI active clamping transistors 24 and 26 embodiment. However, as discussed above, it will be appreciated by others in the art that boolean equivalents and/or other transistors of other double-gated semiconductor technology can also be used in the instant invention. In a preferred embodiment of the double-gated SOI active clamping transistors 24 and 26, an asymmetric gate structure is used with a P+ polysilicon gate as the top gate, and a N+ polysilicon gate as the bottom gate for the double-gated active clamping MOSFET 24, and a P+ polysilicon as the top gate and an N+ polysilicon gate as the bottom gate for the double-gated active clamping MOSFET 26. In so doing, ideal matched sub-threshold slopes are obtained to provide quick transitions and improvement in the reflection coefficient in the transition regions. With the double-gated implementation of the invention, the delay time of the instant double-gate SOI device will provide a short delay time in comparison to a single SOI gate structure. The second or back gate of the circuit 10 is connected to the gate reference electrodes to provide electrical overshoot and undershoot protection for the circuit.

Figure 4:
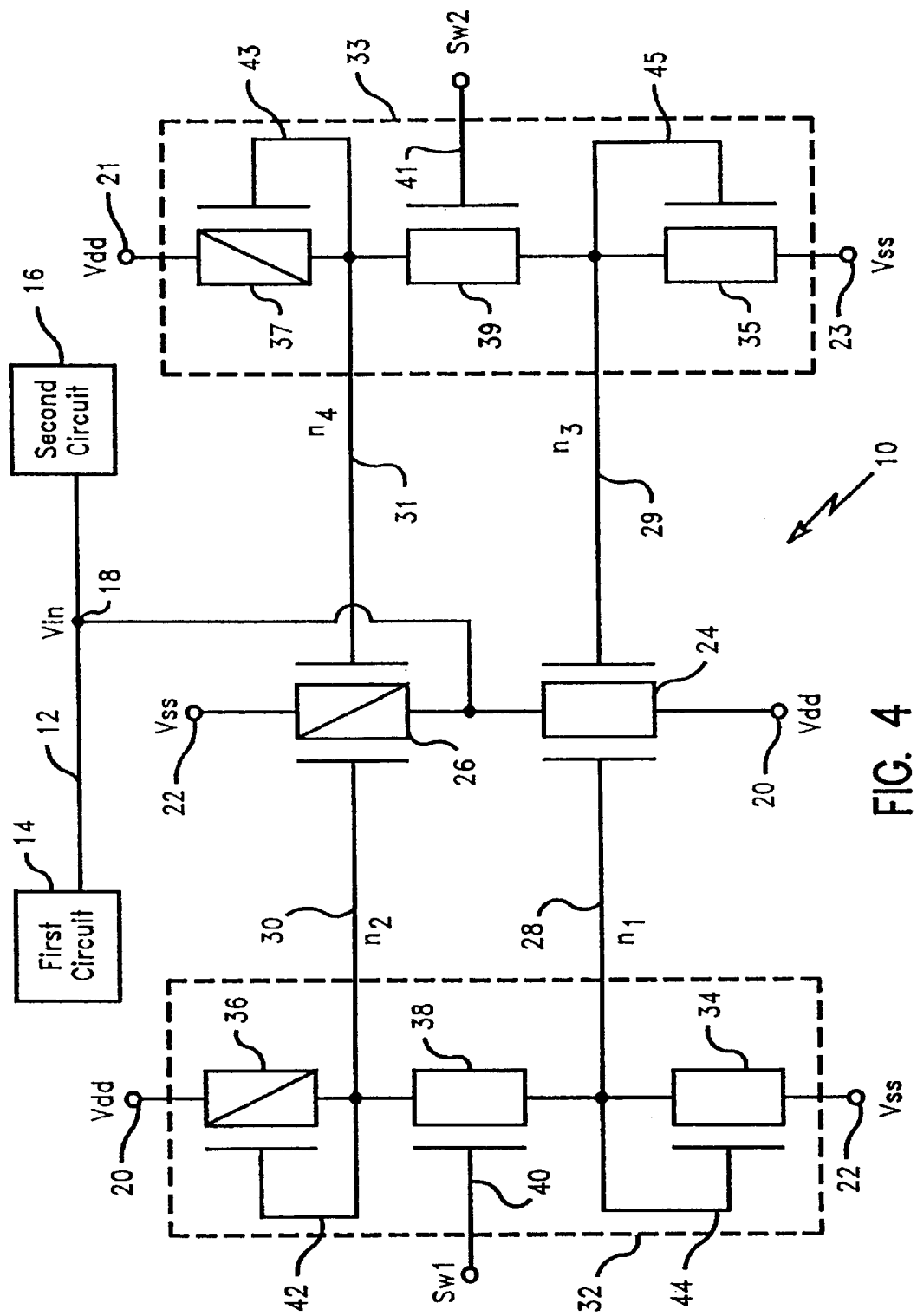
FIG. 4 is a circuit diagram showing a second embodiment of the present invention in which the instant double-gated active clamping network is connected to double reference control circuits and a single power supply voltage.

The active clamping of the instant double-gated active clamping devices is accomplished by attaching a first gate 28 and a second buried gate 29 of double-gated active clamping MOSFET 24 and a first gate 30 and a second buried gate 31 of double-gated active clamping MOSFET 26 to at least one reference control circuit. Preferably, the double-gated active clamping circuits 24 and 26 may be connected to a single reference control circuit 32 as shown in FIG. 3, or alternatively, to double reference control circuits 32 and 33 as shown in FIG. 4.

In accordance with the single reference control circuit 32 embodiment shown in FIG. 3, the double-gated clamping MOSFET 24 is connected to the Vdd power supply terminal 20 and input terminal 18, while the double-gated clamping MOSFET 26 is connected to the Vss power supply terminal 22 and input terminal 18. The switching of clamping MOSFET 24 and clamping MOSFET 26 is achieved through connection of first (or front) control lead gates 28 and 30 and second (or back) control lead gates 29 and 31 to reference circuit 32 to achieve the desired clamping operation.

In the operation of the double-gated active clamping circuit using a single reference circuit 32, the single reference circuit 32 services both the front and back gates of transistors 24 and 26, while setting two voltages. In so doing, the single reference circuit 32 holds the control lead gates 28 and 29 of clamping MOSFET 24 at a constant first reference voltage ni, preferably at the threshold voltage of N-type clamping device (VTN), and the control lead gates 30 and 31 of clamping MOSFET 26 at a constant second reference voltage n2, preferably Vdd minus the threshold voltage of P-type clamping device (VTP). The first reference voltage n1 is less than the second reference voltage n2.

In accordance with the invention, the lower reference voltage n1 is set by reference circuit 32 so that clamping MOSFET 24 turns on and connects input terminal 18 to the upper power supply voltage Vdd whenever the voltage at the input terminal 18 drops below the lower digital voltage (Vss) on network 12. The higher reference voltage n2 is set so that clamping MOSFET 26 turns on and connects input terminal 18 to the lower power supply voltage Vss through power supply terminal 22 whenever the voltage at input terminal 18 exceeds the upper digital voltage (Vdd).

Reference voltage n1 is set so that clamping MOSFET 24 turns on whenever noise, ringing or an electrostatic discharge on the circuit causes the input terminal 18 to fall below Vss. This pulls up the input terminal voltage until it reaches Vss, at which point clamping MOSFET 24 turns off. Similarly, the reference voltage n2 is set by circuit 32 so that clamping MOSFET 26 turns on whenever the voltage at input terminal 18 rises above the upper digital voltage.

The proper operation of clamping MOSFET 24 is achieved by setting the reference voltage n1 equal to the threshold voltage of clamping MOSFET 24 plus Vss. At this value, when the voltage at input terminal 18 drops below Vss, the voltage between input terminal 18 and gates 28, 29 of clamping MOSFET 24 exceeds the threshold voltage for clamping MOSFET 24. Clamping MOSFET 24 then turns on, supplying current from power supply terminal 20 and Vdd to the input terminal 18 rapidly bringing the input terminal voltage back to Vss. As soon as input terminal 18 has reached Vss, clamping MOSFET 24 begins to shut off.

Reference voltage n2 on gates 30, 31 of clamping MOSFET 26 is set to Vdd minus the threshold voltage of clamping MOSFET 26. Then when the voltage at input terminal 18 exceeds Vdd, the voltage between gate 30, 31 of clamping MOSFET 26 and input terminal 18 exceeds the threshold voltage of clamping MOSFET 26, turning it on. This connects input terminal 18 to Vss, rapidly reducing the voltage at input terminal 18 to Vdd.

Thus, the single control reference circuit 32 controls both the front gates 28 and 30 and the back gates 29 and 31 of each of MOSFETs 24 and 26. As discussed above, the states of the front and back gates are a function of the threshold voltage, which in turn, is dependent on the dielectric material of the circuit, the thickness of the dielectric material, the doping concentration in the channel and the doping concentration and polarity of the polysilicon gate material.

The single reference circuit 32 is most easily constructed through the use of the three MOSFETs as shown in FIG. 3. These three transistors include a third transistor 34 coupled to the second power supply terminal 22, a fourth transistor 36 coupled to the first power supply terminal 20, and a fifth transistor 38 serially connected between the third and fourth transistors 34 and 36. Transistor 34 is preferably an N-type MOSFET and transistor 36 is preferably a P-type MOSFET. Transistor 38 is preferably a large gate length N-type MOSFET 38 which has a control lead 40. N-type MOSFET 38 can turn off the circuit 10 by turning off current flow from Vdd through MOSFETs 36, 38 and 34 to Vss. Control lead 40 controls the on/off state of MOSFET 38 and thereby controls the on/off state of circuit 10. Although MOSFET 38 is preferably shown as an N-type FET, if the opposite switching logic is desired, transistor 38 can be a P-type MOSFET.

The gate 42 of transistor 36 is connected between MOSFETs 36 and 38 and to the gates 30 and 31 of MOSFET 26. This automatically sets the reference voltage n2 at gates 30 and 31 to Vdd minus the threshold voltage of P-type MOSFET 36. Since MOSFET 26 is also a P-type MOSFET, reference voltage n2 will be correct. The gate 44 of MOSFET 34 is connected between MOSFETs 34 and 38 and to the gates 28 and 29 of MOSFET 24 to produce the first reference voltage n1. This automatically sets the reference voltage n1 at gates 28 and 29 of MOSFET 24 to Vss plus the threshold voltage of N-type MOSFET 34. Since MOSFET 24 is also an N-type MOSFET, reference voltage n1 will be correct.

Transistor 38 acts as a switch which allows no current to flow when its gate voltage on gate 40 is low. When no current flows in this path, MOSFETs 24 and 26 are turned off and operate only passively. When the gate voltage on gate 40 is high, transistor 38 is turned on and current flows from Vdd through transistors 36, 38 and 34 to the lower power supply voltage Vss, setting the reference voltages n1 and n2 as described above.

In the single control reference double-gated active clamping network, as shown in FIG. 3 in both MOSFET 24 and 26, respectively, the back gate 29 is electrically connected to the front gate 28 of the MOSFET 24, while the back gate 31 is electrically connected to the front gate 30 of the MOSFET 26. In an embodiment where the MOSFET bodies of the clamping transistors are connected to the input pad of the transistor, a "reverse body effect" occurs. That is, as the body voltage of the clamping transistor rises, the threshold voltage decreases. As a result, the gate with the lower threshold voltage turns on first followed by turning on of the respective second gate of such lower threshold voltage gate.

Alternatively, the double-gated active clamping network may be connected to double reference control circuits 32 and 33 as shown in FIG. 4. As shown, the front gate 28 of MOSFET 24 is electrically connected to gate 44 of transistor 34 while the back gate 29 is electrically connected to gate 45 of transistor 35. Likewise, the front gate 30 of MOSFET 26 is electrically connected to gate 42 of transistor 36 while the back gate 31 is electrically connected to gate 43 of transistor 37. In such double control reference circuit, a first control reference circuit 32 is connected to and controls front gates 28 and 30 while a second control reference circuit 33 is connected to and controls back gates 29 and 31 of each of MOSFETs 24 and 26.

In the double control reference circuit embodiment, the first control reference circuit 32 has the same architecture as discussed above. Like the first control reference circuit 32, the second control reference circuit 33 is also most easily constructed through the use of the three MOSFETs as shown in FIG. 3. These three transistors include a third transistor 35 coupled to the second power supply terminal 22, a fourth transistor 37 coupled to the first power supply terminal 20, and a fifth transistor 39 serially connected between the third and fourth transistors 35 and 37.

Transistor 35 is preferably an N-type' MOSFET and transistor 37 is preferably a P-type MOSFET. Transistor 39 is preferably a large gate length N-type MOSFET 39 which has a control lead 41. N-type MOSFET 39 can turn off the circuit 10 by turning off current flow from Vdd through MOSFETs 37, 39 and 35 to Vss. Control lead 41 controls the on/off state of MOSFET 39 and thereby controls the on/off state of circuit 10. Although MOSFET 39 is preferably shown as an N-type FET, if the opposite switching logic is desired, transistor 39 can be a P-type MOSFET.

In the double control reference circuit embodiment of the invention, the first reference circuit 32 is connected to gate 42 of transistor 26 which is connected between MOSFETs 26 and 38 and to the front gate 30 of MOSFET 26. This automatically sets the reference voltage n2 at the front gate 30 to Vdd minus the threshold voltage of P-type MOSFET 26. Since MOSFET 26 is also a P-type MOSFET, reference voltage n2 will be correct. First reference circuit 32 is also connected to gate 44 of MOSFET 34 which is connected between MOSFETs 34 and 38 and to the gate 28 of MOSFET 24 to produce the first reference voltage n1. This automatically sets the reference voltage n1 at the gate 28 of MOSFET 24 to Vss plus the threshold voltage of N-type MOSFET 34. Since MOSFET 24 is also an N-type MOSFET, reference voltage n1 will be correct.

As further illustrated in FIG. 4, the second reference circuit 33 connects to the back gates of MOSFETs 24 and 26. In particular, the gate 43 of transistor 2 is connected between MOSFETs 26 and 39 and to the back gate 31 of MOSFET 26. This automatically sets the reference voltage n4 at the back gate 31 to Vdd minus the threshold voltage of P-type MOSFET 26. Since MOSFET 26 is also a P-type MOSFET, reference voltage n2 will be correct. Second reference circuit 33 is also connected to gate 45 of MOSFET 35 which is connected between MOSFETs 35 and 39 and to the back gate 29 of MOSFET 24 to produce the first reference voltage n3. This automatically sets the reference voltage n3 at the back gate 29 of MOSFET 24 to Vss plus the threshold voltage of N-type MOSFET 35. Since MOSFET 24 is also an N-type MOSFET, reference voltage n3 will be correct.

Transistor 38 of the first reference circuit 32 controls the front gates 28 and 30 by acting as a switch which will allow no current to flow when its gate voltage on gate 40 is low. When no current flows in this path, MOSFETs 24 and 26 are turned off and operate only passively. When the gate voltage on gate 40 is high, transistor 38 is turned on and current flows from Vdd through transistors 36, 38 and 34 to the lower power supply voltage Vss, setting the reference voltages n1 and n2 as described above.

Transistor 39 of the second reference circuit 33 controls the back gates 29 and 31 by acting as a switch which will allow no current to flow when its gate voltage on gate 41 is low. When no current flows in this path, MOSFETs 24 and 26 are turned off and operate only passively. When the gate voltage on gate 41 is high, transistor 39 is turned on and current flows from Vdd through transistors 37, 39 and 35 to the lower power supply voltage Vss, setting the reference voltages n3 and n4 as described above.

In accordance with the double control reference circuit embodiment of the instant double-gated SOI active clamping network, the first reference control circuit 32 and the second reference control circuit 33 can have the same reference voltage. That is, where the gate oxide thickness and/or doping concentration of the front and back gates of the MOSFETs 24 and 26 are equal, reference voltage n2 at the front gate 30 will equal reference voltage n4 at the back gate 31 of MOSFET 26, while reference voltage n1 at the front gate 28 will equal reference voltage n3 at the back gate 29 of MOSFET 24. Depending on the threshold and leakage requirements, where the gate oxide thickness and/or doping concentration of the front and back gates differ, the reference voltages will likewise differ therewith.

Further in accordance with the instant double control reference circuit embodiment, in reference circuit 33, gates 41, 43 and 45 can be used as either the front gates or the back gates of their respective MOSFETs 37, 39 and 35, or alternatively, as a combination of front and back gates. Likewise, in reference circuit 32, gates 42, 40 and 44 can be used as either the front gates or the back gates of their respective MOSFETs 36, 38 and 34, or alternatively, as a combination of front and back gates. Accordingly, the double control reference circuit embodiment of the invention provides at least four different switching conditions. In so doing, the reference switching voltages may be changed, or switched, so that the front and back gates of each of the MOSFETs 24 and 26 turn-on at the same voltage condition.

Accordingly, the "turn-on" of the gates in the double control reference circuit embodiment can occur concurrently or sequentially for different conditions and the VT references can be set as desired. In this embodiment, using a double gated control switch, the "off" state can be better controlled as well as having a "switch" with high current drive to initiate it when it is necessary and keep it off when desirable. Because of the double gate short channel effect improvements, it is desirable to use the double gate version for the center control switch.

Although the reference circuits 32 and 33 shown in FIG. 4 are simple and highly effective, other reference circuits may be used to provide the desired reference voltages n1, n2, and n3, n4. These reference voltages set the limit voltages at which the clamping circuit begins to operate. Whenever the range between the two limit voltages is exceeded, i.e., whenever the range between n1 and n2, or n3 and n4 is exceeded, the clamping action begins. Most often, the lower limit voltage will be set to the lower digital voltage at ground potential and the upper limit voltage will be set to the upper digital voltage.

If higher performance circuit operation is desired, however, the reference voltage n1 can be raised and the reference voltage n2 lowered. This can be done by lowering the resistance of MOSFET 38 or by changing the characteristics of MOSFET 34 or 36.

The same is true for reference voltages n3 and n4. That is, the reference voltage n3 can be raised and the reference voltage n4 lowered by lowering the resistance of MOSFET 39 or by changing the characteristics of MOSFET 35 or 37. This increases the steady state current at the upper and lower digital voltage levels and reduces the overshoot and voltage swing to improve the delay performance of the circuit 10 and the net 12. Typically the circuit of this invention will be implemented on a single chip with circuit 16 and the characteristics of all the transistors may be adjusted during construction.

Accordingly, wherein there are two reference circuits having the same power supply voltage connected to the instant double-gated active clamping circuit, a first and second reference can be established by utilizing a top gate reference circuit for the top gates and a bottom gate reference circuit for the bottom gates. In so doing, both transistors can be turned on at the same power supply voltage.

As discussed above, in accordance with the present invention, the circuit of FIGS. 3 or 4 may be implemented in an SOI or bulk triple well implementation with the potential of the surrounding semiconductor material of each transistor adjusted to a desired level which may be Vss, Vdd, some other fixed reference voltage, a modulated voltage, or the potentials may be allowed to float in a "floating body" SOI implementation.

Accordingly, as SOI transistors, and the like, continue to scale down in size in future generations, the thin film oxide layer over the buried oxide region of the SOI becomes thinner resulting in transistors with increased current drive. The instant invention unexpectedly provides the advantage of using the back gate of a double-gated active clamp transistor to build a lower capacitance and higher current drive juncture for added ESD protection. Advantageously, the instant double-gated active clamp circuit switches right at the power supply voltage resulting in a faster ESD protection in comparison to diode protection circuit as well as a single gate active clamp circuit. In switching of the circuit right before the input terminal swings, the improved ESD performance or reduced resistance occurs as a result of being able to turn on two surfaces to get more current clamping characteristic or discharge more current from the device as well as lower the resistance. The use of a second or back gate of an active clamping circuit also provides the advantage of being able to set two different threshold voltages or turn-on voltages. The different switching points having different threshold voltages may be provided by varying, for example, the oxide thicknesses of the transistor, the doping concentration of the gates, the thicknesses of the gates, and the like.

In a symmetric double-gated transistor, wherein both oxide thicknesses of both the front and back gate structure are identical, the double-gated active clamp transistor provides twice as much current, in comparison to a single gate active clamp transistor, thereby resulting in a higher performance and faster circuit. Thus, the use of the back gate of the double-gated active clamp transistor for the added ESD protection allows for maintaining current in smaller devices and allows for twice the amount of clamping in comparison to single gated devices.

Alternatively, the back gate of the double-gated active clamp transistor may be used for added ESD protection in an asymmetric double-gated transistor, wherein the oxide thicknesses of both the front and back gate structure are not identical. As it has unexpectedly been recognized that a thin front gate of a double-gated structure is less suitable for ESD protection as it is more susceptible to damage, the back gate of the double-gated MOSFET can be used for ESD protection as a result of the ability to introduce a thicker back gate within the double-gated MOSFET. Thus, a thicker back gate of the double-gated MOSFET is more suitable for clamping and ESD protection. Furthermore, wherein the double-gated MOSFET has asymmetrical front and back gates, advantageously, either the front or back gate of the structure can be used to lower leakage current thereby reducing the leakage current, to decrease the power consumption, as well as to use one or the other when the transistor is off for ESD protection.

In accordance with the invention, the double gates may be used simultaneously, or alternatively, at different times. For example, in an SOI double-gated active clamping transistor, the front gate over the thin oxide may be off while only the back gate in the thick oxide region is on. The invention also adds the flexibility to be able to use the same physical transistor for different power supply conditions, e.g., the front gate may be a polysilicon gate and the bottom gate may be a metal gate.

Figure 5:
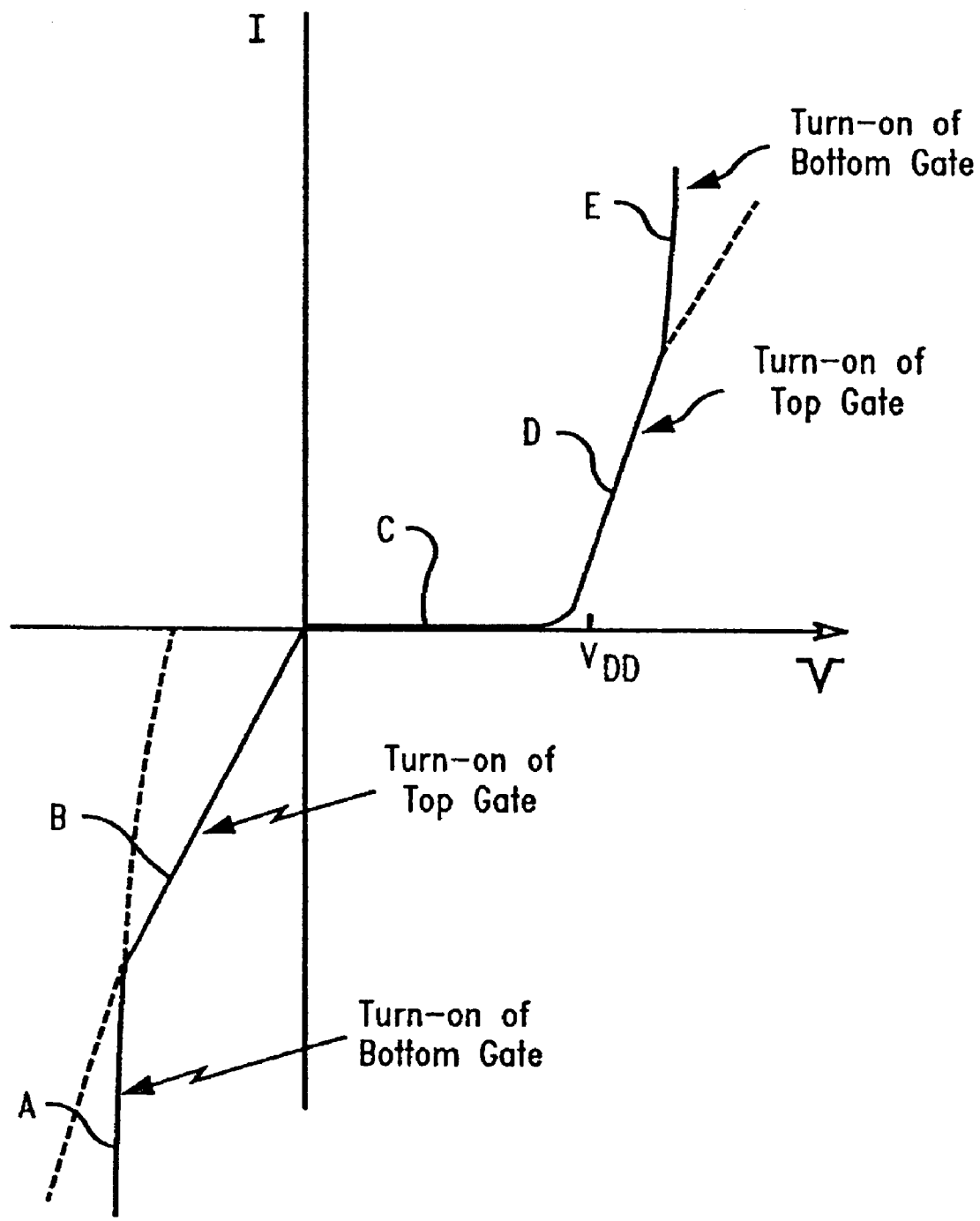
FIG. 5 is a graph of input current as a function of input voltage for a double-gated active clamping circuit constructed in accordance with the present invention.

FIG. 5 provides a graph of current into double-gated clamping circuit 10 through input terminal 18 as a function of the input voltage Vin where Vss is set to 0 volts and Vdd is set to positive voltage. Graph of FIG. 5 illustrates the I–V characteristics showing the two step transition in a dual gate clamp circuit wherein as the gate voltages exceed the "on" state, current conduction will occur above and below the power supply condition, e.g., VSS, VDD and VCC. As shown by the region marked "A" where Vin is less that Vss, the front gate 28 of MOSFET 24 is on and current is flowing out of the double-gated clamping circuit 10 and into the network 12 at the input circuit 16. In the region marked "B" the bottom gate 29 of MOSFET 24 is on showing an increase in the ESD protection in comparison to a single gated circuit, as represented by the deeper slope of region "B." In the region marked "C" there is no current flow through the input terminal 18 and both MOSFETs 24 and 26 are off. In the region marked "D", right before Vdd, the front gate 30 of MOSFET 26 turns on and current is flowing in the opposite direction from the input terminal 18 through MOSFET 26 to ground. In the region marked "E", the back gate 31 of MOSFET 26 turns on and current is flowing faster in an opposite direction from the input terminal 18 through MOSFET 26 to ground as represented by the sharp slope of region "E". In an embodiment wherein there is a single reference, the turn-on of the top and bottom gate will be sequential at different voltage conditions. In an embodiment wherein here is two reference circuits with a common power supply condition, a low impedance single state will be evident.

Figure 6:
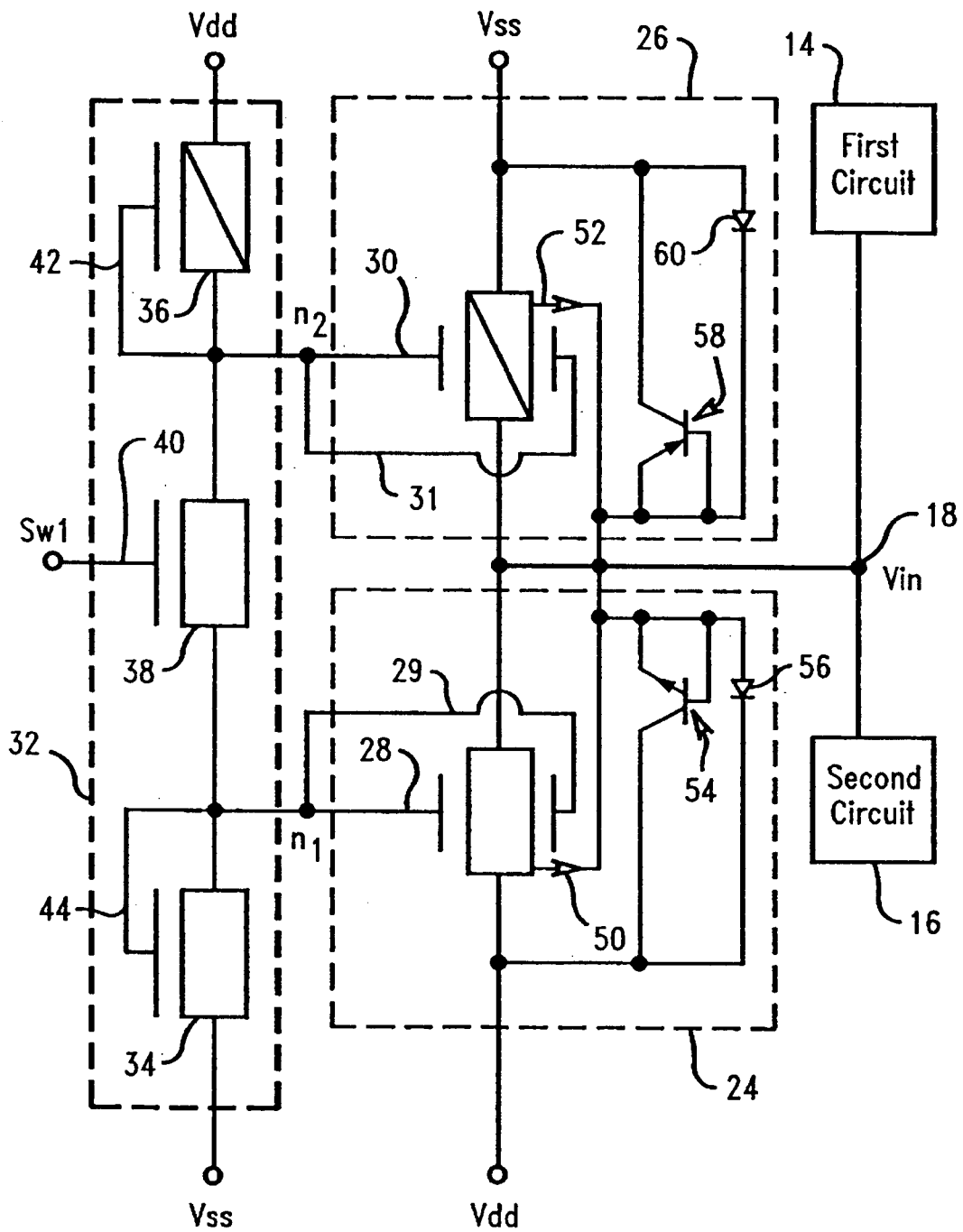
FIG. 6 is a circuit diagram showing a third embodiment of the instant double-gated active clamping network in which DTMOS field effect transistors are used and parasitic bipolar transistors and diode junctions are shown.

FIG. 6 is provided to show one particular SOI or bulk triple well design with specific advantages for the present invention. In SOI and bulk triple well processes the body of each transistor, or of desired groups of transistors, may be electrically isolated from the body of other transistors on the substrate. This allows the potential of the isolated semiconductor material to be adjusted without affecting the performance of other transistors. As discussed above, in SOI designs, the transistors are isolated by an insulating oxide layer. In bulk triple well designs, the transistors are isolated by multiple concentric doped regions of decreasing size (the "wells") which provide diode junction isolated islands within which the transistors are formed.

Although circuits using SOI and bulk triple well technology have performance advantages over comparable circuits built with conventional MOS technology, the SOI/triple well designs often have difficulties with proper network termination, clamping and ESD protection. These problems arise as a result of the electrical isolation of the transistors. The instant invention of the double-gated active clamping network provides additional ESD protection to SOI or bulk triple well designs as such technologies continue to decrease in size.

FIG. 6 illustrates the same basic circuit design seen in FIG. 3, wherein the back gates 31 and 29 of the instant double-gated clamp network provide the same clamping and ESD protection as described above, except that FIG. 6 is shown implemented in an SOI or bulk triple well embodiment and body leads 50 and 52 are shown for transistors 24 and 26 allowing connection to the surrounding semiconductor material (the "bodies") of these two transistors. FIG. 6 also shows other parasitic diode and bipolar semiconductor elements. MOSFET 24 is illustrated with a parasitic NPN transistor 54 and a parasitic diode 56. MOSFET 26 is shown with a parasitic PNP transistor 58 and parasitic diode 60. While these parasitic elements are also found in conventional MOS technologies, they play a different and important role in the SO/triple well design due to the modulated potential of the bodies of MOSFETs 24 and 26.

During construction of a MOSFET with SOI/triple well or similar technology, it is possible to connect the body of the transistor to the double-gate structure on the device. When the body is tied to the double-gates in this manner, the threshold voltage, i.e., the voltage needed to turn on the transistor, decreases with increasing body voltage. This characteristic results in a MOSFET with a dynamic threshold and the device may generally be referred to as a dynamic threshold MOS (DTMOS) transistor. DTMOS transistors of this type are known.

Transistors 24 and 26, when bodies 50 and 52 are connected as shown in FIG. 6, also provide dynamic threshold operation, and for the purpose of this invention are also considered DTMOS transistors. However, in the embodiment of the present invention shown in FIG. 6, the bodies are not connected to the gates, but instead, are connected to the input 18.

A first benefit from the use of DTMOS devices in this invention is directly due to the dynamic threshold voltage operation described above. In the conventional implementation of FIG. 3, the double-gated MOSFETs begin to turn on as soon as the input terminal voltage at 18 begins to exceed the normal digital voltage range of Vss to Vdd. The extent to which the double-gated MOSFET is turned on is related to the amount by which the voltage between the double-gates of the MOSFET and the input terminal 18 exceeds the MOSFET's threshold voltage. The greater this difference, the larger the current flow through the MOSFET and the faster the input terminal voltage is clamped. Accordingly, the back gate provides a second dynamic threshold voltage state and a second surface area for conduction.

In the DTMOS design shown in FIG. 6, the same action occurs, but the rate at which the transistors turn on and the extent to which they are turned on is greatly increased because the threshold voltage dynamically falls as the MOSFET turns on, instead of remaining constant. As the input voltage rises at 18, in the vicinity of Vdd (1.8 volts) the threshold voltage of MOSFET 26 dynamically decreases turning on MOSFET 26 in the dynamic threshold mode more quickly and more completely than in a non-DTMOS design of the type shown in FIG. 1. MOSFET 24 operates in a similar manner in the vicinity of 0.0 volts. This operation significantly increases the performance of clamping circuit 10 over a MOSFET operated without the dynamic threshold feature.

A second advantage relates to the parasitic diodes 56 and 60. In the design shown in FIG. 6, the bodies of the MOSFETs 24, 26 are connected to the input terminal 18 via body connection leads 50, 52. This allows parasitic diodes 56 and 60 to act between the power supply voltages and the input terminal in the same way as a prior art passive diode clamp acts. Parasitic diode 56 turns on whenever the voltage at input terminal 18 exceeds Vdd plus the turn on voltage of diode 56. Parasitic diode 60 turns on whenever the input voltage at 18 falls below a diode drop beneath Vss. When these diodes turn on, they provide additional clamping and protection beyond that provided by the performance of the MOSFETs themselves. Accordingly, in addition to the back gate of the instant double-gated clamp providing additional clamping and ESD protection, the diodes turn on to provide further clamping and protection beyond that provided by the performance of the double-gated clamping MOSFETs themselves.

Not only does the instant double-gated active clamping network add additional clamping and ESD protection to future generations of switchable active clamp networks having single power supply voltages, such as discussed above, the instant invention may also be used in such future generations of switchable active clamp networks having multiple power supply voltages for added clamping and ESD protection, such as those disclosed in U.S. Pat. No. 6,229,372 B1 incorporated by reference. The use of the back gate of the instant double-gated active clamping network enables the additional clamping and ESD protection for smaller generations of transistors, such as those having dimensions below 0.1 micron, preferably those ranging from about 0.1 micron to about 0.01 micron.

Figure 7:
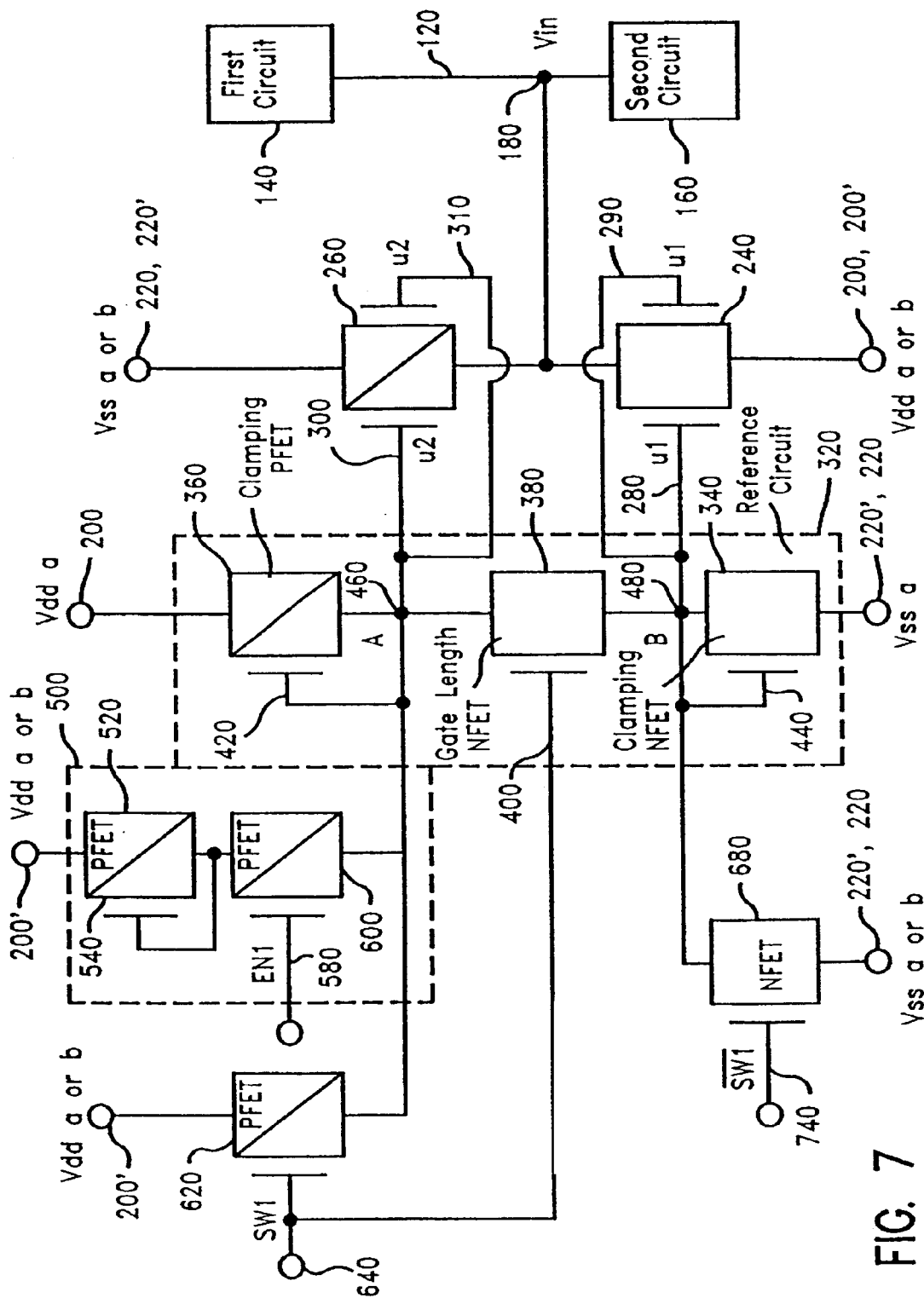
FIG. 7 is a circuit diagram showing a fourth embodiment of the present invention in which the instant double-gated active clamping network is connected to a single reference control circuit and multiple power supply voltages.
Figure 8:
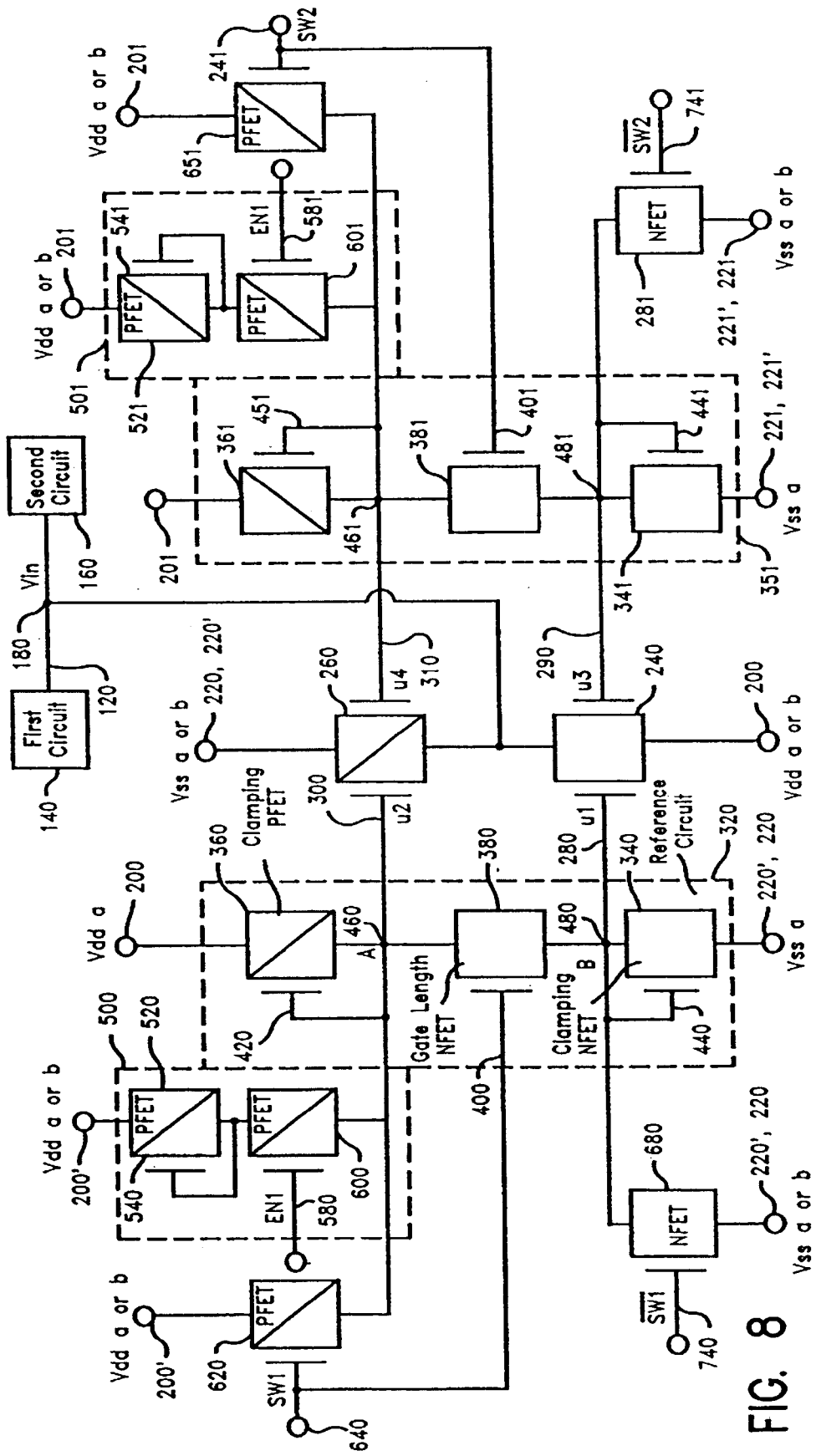
FIG. 8 is a circuit diagram showing a fifth embodiment of the present invention in which the instant double-gated active clamping network is connected to double reference control circuits and multiple power supply voltages.

For ease of understanding the invention, the multiple power supply voltage embodiment of the instant double-gated active clamp network which adds additional clamping and ESD protection in comparison to a single gated structure will be discussed in relation to FIG. 7 showing a single control reference embodiment and FIG. 8 showing a double control reference embodiment. Although FIGS. 7 and 8 show one embodiment for each the single and double control reference circuits of the multiple power supply voltage embodiment of the invention, it will be appreciated by others in the art that boolean equivalents and/or other transistors of other double-gated semiconductor technology as well as other multiple power supply voltage systems can also be used in the instant invention.

In FIGS. 7 and 8, clamping fets 240 includes front gate 280 and back gate 290 and clamping fets 260 includes front gate 300 and back gate 310. FIG. 7 shows the single control reference embodiment of the multiple power supply voltage circuit whereby back gate 290 is electrically connected to front gate 280 to provide the added clamping and ESD protection as discussed above, particularly in relation to FIG. 3 above. FIG. 8 shows the single control reference embodiment of the multiple power supply voltage circuit whereby back gate 290 is electrically connected to front gate 280 to provide the added clamping and ESD protection as discussed above, particularly in relation to FIG. 3 above.

For further ease of understanding the multiple power supply voltage embodiment, the single control reference circuit of FIG. 7 is discussed below, however the double control reference circuit of FIG. 8 will be appreciated and understood by others in the art in view of the discussion above in relation to the double control reference circuit of the single power supply voltage system of FIG. 4 and the discussion of the multiple power supply voltage embodiment of FIG. 7 below.

In FIG. 7, the reference circuit 320 controls the switching of the clamping fets 240 and 260 to achieve the desired clamping operation. Reference circuit 320 holds node B 480 at the control gate 280 of clamping nfet 240 at a first constant reference voltage and node A 460 at control gate 300 of clamping pfet 260 at a second constant reference voltage. The first reference voltage is less than the second reference voltage. The lower reference voltage at node B 480 is set by reference circuit 320 to be equal to the threshold voltage of clamping nfet 240 plus Vss. When the voltage at input terminal 180 drops below Vss sub. a or b, the voltage between input terminal 180 and gate 280 of clamping nfet 240 exceeds the threshold voltage for clamping nfet 240. Clamping nfet 240 then turns on, supplying current from a power supply terminals 200, 200' of Vdd to the input terminal 180 rapidly bringing the input terminal voltage back to Vss. As soon as input terminal 180 has reached Vss sub. a or b, clamping nfet 240 begins to shut off. Similarly, the reference voltage at node A 460 on gate 300 of clamping pfet 260 is set to Vdd minus the threshold voltage of clamping pfet 260. When the voltage at input terminal 180 exceeds a clamping voltage of the threshold voltage of clamping pfet 260 plus the voltage at node B, it turns on to connect the input terminal 180 to Vss sub a or b, rapidly reducing the voltage at input terminal 180 to Vdd. In other words, the voltage at node B 480 is set so that clamping nfet 240 turns on whenever noise, ringing or an electrostatic discharge on the circuit causes the input terminal 180 to fall below Vss. Clamping nfet 240 pulls the input voltage at terminal 180 up until it reaches Vss at which point clamping nfet 240 turns off. Similarly, the reference voltage at node A 460 is set by reference circuit 320 so that clamping pfet 260 turns on whenever the voltage at input terminal 180 rises above the upper clamping voltage and drains the voltage until the upper clamping voltage limit is reached.

In FIG. 7, reference circuit 320 is mbst easily constructed using a first transistor, preferably a nfet 340, coupled to a lower voltage power supply terminal 220; a second transistor, a pfet 360, coupled to an upper power supply terminal 200; and a third transistor, preferably a large gate length nfet 380, serially connected between the nfet 340 and the pfet 360. A signal SW1 640 controls the gate 400 of nfet 380 which turns it on and off thereby controlling the on/off state of clamping circuit 100. Nfet 380 can turn off the clamping circuit 100 by turning off current flow from the upper power supply Vdd through pfet 360 and from nfets 380 and 340 to Vss. Although nfet 380 is preferably shown as an n-type MOSFET, if the opposite switching logic is desired, transistor 380 can be a pfet. The gate 420 of pfet 360 is connected between pfet 360 and nfet and to the gate 300 of clamping pfet 260. This automatically sets the reference voltage at node A 460 to Vdd minus the threshold voltage of pfet 360. Because clamping pfet 260 is the same dopant type as pfet 360, the reference voltage at node A 460 will be correct. The gate 440 of nfet 340 is connected between nfets 340 and 380 and to the gate 280 of clamping nfet 240 to produce the reference voltage at node B 480. This automatically sets the reference voltage at node B 480 at the gate 280 of clamping nfet 240 to Vss plus the threshold voltage of nfet 340. Likewise, because clamping nfet 240 is also an n-type transistor, the reference voltage at node B 480 is correct.

Nfet 380 acts as a switch which will allows no current to flow when the voltage on gate 400 is low. When no current flows in this path, clamping nfet 240 and clamping pfet 260 are turned off and operate only passively. When the voltage at gate 400 is high, nfet 380 is turned on and current flows from Vdd through transistors 360, 380 and 340 to the lower power supply voltage Vss sub a or b, setting the reference voltages at node A 460 and node B 480 as described above. It is noted that clamping nfet 240 is on all the time so that when signal SW1 640 is off, the voltage at gate 400 of switching nfet 380 is low and the clamping nfet 240 and clamping pfet 260 can float. To ensure that these clamping transistors do not float and are truly off, a pfet 620 terminates the upper voltage power supply and a nfet 680 terminates the lower voltage power supply.

In the embodiment of FIG. 7, there is a stage 500 which when connected in parallel to the reference circuit 320 behaves as a resistor to raise the voltage at node A 460. FET 600 turns on and provides current through pfet 520. When the SW1 signal 640 turns on the gate of pfet 380, current is conducted through the parallel combination of pfet 360 and staging circuit 500. There can be more than one stage 500 connected to different voltage power supplies and with different width of pfets to vary the voltage at node A 460 which in turn customizes the voltage level at which clamping occurs.

Reference circuit 320 can be expanded to provide the desired reference voltages at node A 460 and node B 480. These other reference voltages set the clamping voltages at which the clamping circuit begins to operate. Whenever the range between the two clamping voltages is exceeded, the clamping action begins. Most often, the lower clamping voltage will be set to the lower digital voltage at ground potential and the upper clamping voltage will be set to the upper digital voltage. As mentioned, one can connect pfet 360 to a different voltage supply than clamping pfet 260 and/or connect nfet 340 to a different voltage supply than clamping nfet 240. If higher performance circuit operation is desired, however, the reference voltage at node A 460 can be raised with stages of pfets or lowered with stages of nfets. The reference voltage at node B can be lowered with stages of nfets or raised with stages of pfets. These aspects of the Invention will be further disclosed herein. Another technique to vary the clamping voltages is to lower the resistance of nfet 380 or change the characteristics of nfet 340 or pfet 360 to increase the steady state current at the upper and lower digital voltage levels and reduce the overshoot and voltage swing of the clamping circuit 100 and the net 120. Typically the circuit of this invention will be implemented on a single chip with circuit 160 and the characteristics of all the transistors may be adjusted during construction.

The above implementations of the invention result in a clean signal on net 12 with decreased noise and high reflection co-efficient within the voltage swing. This permits multiple drop point nets instead of point-to-point configurations and provides lower power consumption as compared to split resistive termination networks. This also permits long networks with relatively high line resistance. It also permits lower voltage swing MOS designs using lower voltage power supplies.

The double-gated circuit 10 swings into a high impedance state at exactly the desired point for high switching speed while avoiding overshoot and undershoot as the new digital voltage is reached. This prevents electrical dielectric overstress and latch-up of internal circuits. It achieves good ESD protection results and can become the ESD protection strategy for triple well and SOI designs.

Advantageously, the instant double-gated SOI active clamp network extends the useful life of current active clamp networks by allowing such networks to be connected to future generations of smaller networks, preferably those having dimensions below 0.1 micron, and more preferably those having dimensions ranging from about 0.1 micron to about 0.01 micron. The invention also allows different power supply voltages associated with different products, i.e., allowing an older generation circuit communicate with a newer circuit, to communicate and shift signals from one to the other and be able to capture the signal. The instant double-gated SOI active clamp network may be used as an ESD protection element whereby the second or back gates of the circuit being the same doping concentration as the front gates to provide a higher drive current and a second "trigger" to kick on a low impedance clamping thereby adapting the circuit for higher current carrying capabilities. The invention may also be implemented with differing front and back gate dopants to provide a lower power application in both the reference controllers or in the clamp element themselves.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A double-gated clamping circuit comprising:
   an input terminal for receiving an input voltage;
   a first power supply terminal for connection to at least one first supply voltage;
   a second power supply terminal for connection to a second supply voltage, the second supply voltage being less than the first supply voltage;
   a first transistor having a first and a second control lead, the first transistor being serially connected between the first power supply terminal and the input terminal,
   a second transistor having a first and a second control lead, the second transistor being serially connected between the second power supply terminal and the input terminal; and
   a reference circuit coupled to the first and second control leads of the first and second transistors for maintaining at least first and second preselected reference voltages at the first and second control leads of the first and second transistors, respectively, the first reference voltage being less than the second reference voltage, and
   at least one staging circuit coupled to the first and second control leads of at least one of the first and second transistors to determine a selected reference voltage at the control lead to which the at least one staging circuit is coupled.

2. The double-gated clamping circuit of claim 1, wherein the first and second transistors each having first and second control leads comprise a first double-gated transistor having a front gate and a back gate and a second double-gated transistor having a front gate and a back gate.

3. The double-gated clamping circuit of claim 1, wherein the first and second control leads of the first transistor are electrically coupled to each other and the first and second control leads of the second transistor are electrically coupled to each other.

4. The double-gated clamping circuit of claim 1, wherein the first and second control leads of the first and second transistors are symmetrical.

5. The double-gated clamping circuit of claim 1, wherein the first reference voltage is adjusted to switch on the first transistor and connect the input terminal to the first power supply terminal when the input voltage passes a first limit voltage and the second reference voltage is adjusted to switch on the second transistor and connect the input terminal to the second power supply terminal when the input voltage passes a second limit voltage.

6. The double-gated clamping circuit of claim 5, wherein the first reference voltage is adjusted to the second supply voltage plus a threshold voltage of the first transistor and the second reference voltage is adjusted to the first supply voltage minus a threshold voltage of the second transistor.

7. A double-gated clamping circuit comprising:

an input terminal for receiving an input voltage;

a first power supply terminal for connection to at least one first supply voltage;

a second power supply terminal for connection to a second supply voltage, the second supply voltage being less than the first supply voltage;

a first transistor having a first and a second control lead, the first transistor being serial connected between the first power supply terminal and the input terminal;

a second transistor having a first and a second control lead, the second transistor being serially connected between the second power supply terminal and the input terminal and a reference circuit coupled to the first and second control leads of the first and second transistors for maintaining at least first and second preselected reference voltages at the first and second control leads of the first and second transistors, respectively, the first reference voltage being less than the second reference voltage, wherein the first and second control leads of the first and second transistors are asymmetrical.

8. The double-gated clamping circuit of claim 7, wherein the first control leads of each of the first and second transistors are coupled to a first reference circuit and the second control leads of each of the first and second transistors are coupled to a second reference circuit, the first and second reference circuits maintaining the at least first and second preselected reference voltages at the first and second control leads, respectively, the first reference voltage being less than the second reference voltage.

9. The double-gated clamping circuit of claim 7, wherein the first transistor and the second transistor have bodies constructed on a substrate and the body of the first transistor and the body of the second transistor are electrically isolated from other devices on the substrate.

10. The double-gated clamping circuit of claim 9, wherein the body of the first transistor is electrically connected to the body of the second transistor and to the input terminal.

11. The double-gated clamping circuit of claim 9, wherein the first and second transistors are constructed as dynamic threshold voltage transistors selected from the group consisting of silicon-on-insulator devices, FINFET devices, and triple-well devices.

12. The double-gated clamping circuit of claim 7 combination with a circuit having a circuit input, the input terminal of the double-gated clamping circuit being directly connected to the circuit input and the double-gated clamping circuit preventing overshoot and undershoot of the input voltage relative to desired input voltages at the circuit input.

13. The double-gated clamping circuit of claim 7 in combination with a circuit having a circuit input, the input terminal of the double-gated clamping circuit being directly connected to the circuit input and the double-gated clamping circuit providing electrostatic discharge protection to the input terminal of the circuit.

14. The double-gated clamping circuit of claim 7, wherein the reference circuit comprises at least one reference circuit having a third transistor coupled to the second power supply terminal and a fourth transistor coupled to the first power supply terminal, the third and fourth transistors being serially connected between the first and second power supply terminals.

15. The double-gated clamping circuit of claim 7, wherein the first and second supply voltages are less than five volts.

16. A double-gated clamping circuit comprising:

an input for receiving an input voltage;

a double-gated transistor circuit for clamping the input at both a first voltage and at a second voltage, the transistor circuit including:

a first double-gated transistor coupled to a first power supply terminal at the first voltage and to the input, the first double-gated transistor having a first and a second gate to connect the input to the first power supply terminal through the first transistor when the first transistor is turned on;

a second double-gated transistor coupled to a second power supply terminal at the second voltage and to the input; the second double-gated transistor having a first and second gate to connect the input to the second power supply terminal through the second transistor when the second double-gated transistor is turned on, a first reference circuit coupled to the first gates of each of the first and second double-gated transistors for maintaining preselected constant gate voltages at the first and second gates of each of the first and second double-gated transistors, the gate voltages being independent of the input voltage, and a second reference circuit coupled to the second gates of each of the first and second double-gated transistors for further maintaining the preselected constant gate voltages at the first and second gates of each of the first and second double-gated transistors.

17. The double-gated clamping circuit of claim 16, wherein the first and second reference circuits maintain first, second, third, and fourth preselected reference voltages at the first and second control leads of the first and second transistors, whereby the first and third preselected reference voltages are at the first and second control leads of the first transistors, respectively, and the second and fourth preselected reference voltages are at the first and second control leads of the second transistors, respectively, the first reference voltage being less than the second reference voltage and the third reference voltage being less than the fourth reference voltage.

18. The double-gated clamping circuit of claim 16, further including at least one staging circuit coupled to the first and second control leads of at least one of the first and second transistors to determine a selected reference voltage at the control lead to which the at least one stag circuit is coupled.

19. The double-gated clamping circuit of claim 16, wherein at least one of the first and second transistors is a dynamic threshold voltage MOS field effect transistor.

\* \* \* \* \*